US009627572B2

(12) United States Patent
Okushiba

(10) Patent No.: US 9,627,572 B2
(45) Date of Patent: Apr. 18, 2017

(54) LIGHT RECEIVING AND EMITTING ELEMENT MODULE AND SENSOR DEVICE USING SAME

(71) Applicant: KYOCERA Corporation, Fushimi-ku, Kyoto-shi, Kyoto (JP)

(72) Inventor: Hiroyuki Okushiba, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 171 days.

(21) Appl. No.: 14/397,178

(22) PCT Filed: Apr. 19, 2013

(86) PCT No.: PCT/JP2013/061673
§ 371 (c)(1),
(2) Date: Oct. 24, 2014

(87) PCT Pub. No.: WO2013/161722
PCT Pub. Date: Oct. 31, 2013

(65) Prior Publication Data
US 2015/0115139 A1  Apr. 30, 2015

(30) Foreign Application Priority Data

Apr. 25, 2012  (JP) .................................. 2012-099844

(51) Int. Cl.
H01L 31/00     (2006.01)
H01L 31/167    (2006.01)
(Continued)

(52) U.S. Cl.
CPC .......... H01L 31/167 (2013.01); G01S 7/4813 (2013.01); G01S 17/026 (2013.01);
(Continued)

(58) Field of Classification Search
CPC .......... H01L 31/0203; H01L 31/02164; H01L 31/167
(Continued)

(56) References Cited

U.S. PATENT DOCUMENTS 5,023,442 A * 6/1991 Taniguchi ................ B41J 2/451
                                                    250/208.1
6,751,395 B1   6/2004 Novotny et al.
(Continued)

FOREIGN PATENT DOCUMENTS

JP   4-103665 U    9/1992
JP   05-152603 A   6/1993
(Continued)

OTHER PUBLICATIONS

Office Action dated Oct. 13, 2015, issued in counterpart Japanese Application No. 2014-512534.
(Continued)

Primary Examiner — Kevin Pyo
(74) Attorney, Agent, or Firm — Procopio Cory Hargreaves and Savitch LLP

(57) ABSTRACT

A light receiving and emitting element module includes a substrate; a light emitting element and a light receiving element on an upper surface of the substrate; a frame-shaped outer wall that on the upper surface of the substrate; and a light shielding wall that is positioned inside the outer wall and partitions an internal space of the outer wall into spaces respectively corresponding to the light emitting element and the light receiving element. The light shielding wall includes a light emitting element-side shading surface on the light emitting element side, a light receiving element-side shading surface on the light receiving element side, and a lower surface that is connected to each of the light emitting element-side shading surface and the light receiving ele-
(Continued)

ment-side shading surface, and that faces the substrate. The lower surface has an inclined surface inclined with respect to the upper surface of the substrate.

9 Claims, 4 Drawing Sheets

(51) Int. Cl.
*G01S 17/02* (2006.01)
*G01V 8/10* (2006.01)
*H01L 31/173* (2006.01)
*H03K 17/94* (2006.01)
*G01S 7/481* (2006.01)
*H01L 31/0203* (2014.01)

(52) U.S. Cl.
CPC ............ *G01V 8/10* (2013.01); *H01L 31/0203* (2013.01); *H01L 31/173* (2013.01); *H03K 17/941* (2013.01); *H03K 2217/94108* (2013.01)

(58) Field of Classification Search
USPC ............... 250/239, 221, 222.1, 551; 356/614
See application file for complete search history.

(56) References Cited

U.S. PATENT DOCUMENTS

| | | | |
|---|---|---|---|
| 2003/0031451 A1 | 2/2003 | Hong et al. | |
| 2003/0189213 A1 | 10/2003 | Igaki et al. | |
| 2009/0095881 A1* | 4/2009 | Funakubo | ................ G01J 1/24 250/205 |

FOREIGN PATENT DOCUMENTS

| | | |
|---|---|---|
| JP | 2003-066268 A | 3/2003 |
| JP | 2004-006753 A | 1/2004 |
| JP | 2005-147955 A | 6/2005 |
| JP | 2007-013050 A | 1/2007 |
| JP | 2007-201360 A | 8/2007 |
| JP | 2008-010832 A | 1/2008 |
| JP | 2009-99950 A | 5/2009 |
| JP | 2010-278239 A | 12/2010 |
| WO | 03/042733 A1 | 5/2003 |

OTHER PUBLICATIONS

International search report dated May 21, 2013 issued for International application No. PCT/JP2013/061673.
Office Action dated Dec. 27, 2016 issued by the Japan Patent Office in counterpart Japanese Application No. 2015-174748 and concise explanation, 4 pgs.

* cited by examiner (a)

(b)

(a)

(b)

(a)

(b)

(c)

LIGHT RECEIVING AND EMITTING ELEMENT MODULE AND SENSOR DEVICE USING SAME

TECHNICAL FIELD

The present invention relates to a light receiving and emitting element module in which a light receiving element and a light emitting element are on the same substrate, and a sensor device using the same.

BACKGROUND ART

In the related art, various types of sensor devices which irradiate an irradiation object with light from a light emitting element, receive specular reflection light and diffused reflection light with respect to light incident on the irradiation object by the light receiving element and detect a characteristic of the irradiation object have been suggested. The sensor device is used in a wide range of fields, and is used as an application in various ways such as a photo-interrupter, a photo-coupler, a remote control unit, an infrared data association (IrDA) communication device, an optical fiber communication apparatus, and a document size sensor.

For example, as described in Japanese Unexamined Patent Application Publication No. 2007-201360, a sensor device is used in which a light emitting element and a light receiving element are arranged on the same substrate, and a shielding wall that separates a light receiving area and a light emitting area is provided.

However, a sensor device as described above has a problem in that a gap is generated between the substrate and the light shielding wall, and light leaks through the gap so that it is difficult to enhance the sensing performance of the sensor device.

An object of the invention is to provide a light receiving and emitting element module having high sensing performance, and a sensor device using the same.

SUMMARY OF INVENTION

A light receiving and emitting element module according to the invention includes a substrate; a light emitting element and a light receiving element on an upper surface of the substrate; an outer wall that is frame-shaped and encloses the light emitting element and the light receiving element on the upper surface of the substrate; and a light shielding wall that is positioned inside the outer wall and partitions an internal space of the outer wall into spaces respectively corresponding to the light emitting element and the light receiving element. The light shielding wall includes a light emitting element-side shading surface on the light emitting element side, a light receiving element-side shading surface on the light receiving element side, and a lower surface that is connected to each of the light emitting element-side shading surface and the light receiving element-side shading surface, and faces the substrate. The lower surface has an inclined surface that is inclined with respect to the upper surface of the substrate.

BRIEF DESCRIPTION OF DRAWINGS

FIG. 1(*b*) is a schematic cross sectional view taken along line 1I-1I of FIG. 1(*a*).

FIG. 2(*b*) is a cross-sectional view illustrating a light receiving element that configures the light receiving and emitting element module illustrated in FIG. 1.

DESCRIPTION OF EMBODIMENTS

Hereinafter, exemplary embodiments of a light receiving and emitting element module of the invention and a sensor device using the same are described with reference to the drawings. Further, examples below are provided to exemplify the embodiments of the invention, and the invention is not limited to the embodiments.

(Light Receiving and Emitting Element Module)

Figure 1:
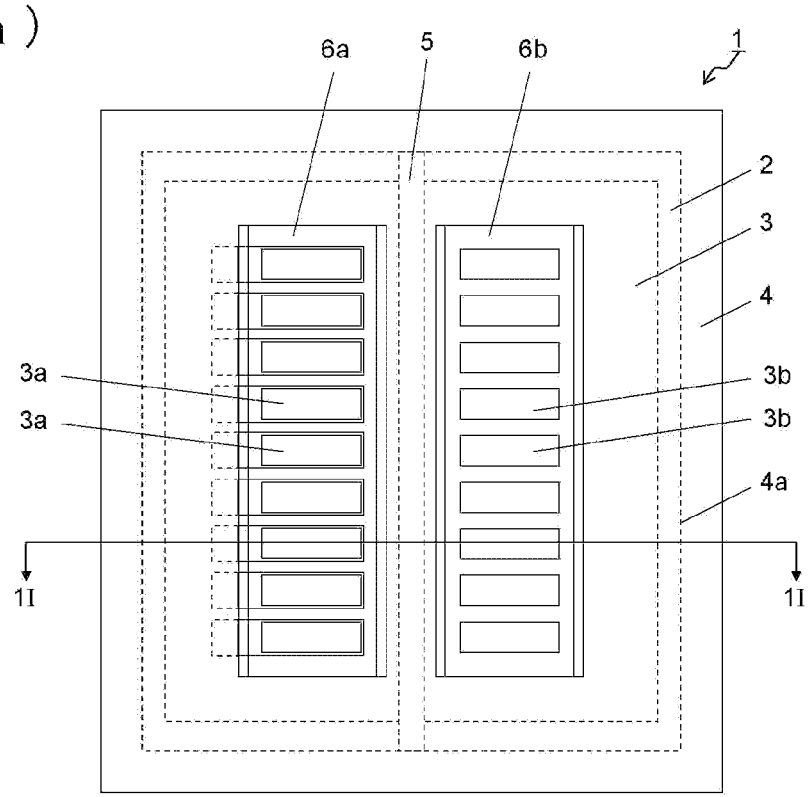
FIG. 1(*a*) is a plan view illustrating an exemplary embodiment of a light receiving and emitting element module according to the invention.
Figure 1:
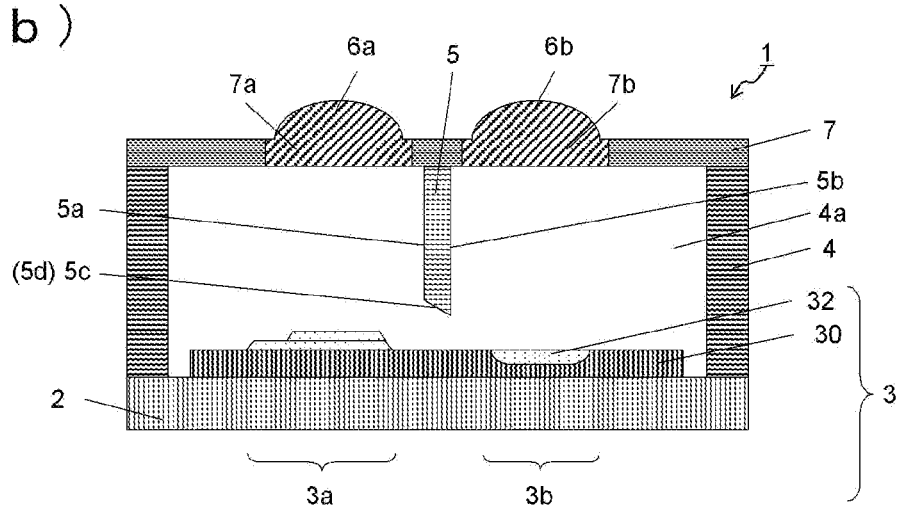

A light receiving and emitting element module 1 illustrated in FIGS. 1(*a*) and 1(*b*) is integrated with an image forming apparatus such as a copying machine or a printer, and functions as a sensor device that detects location information, distance information, or density information of an irradiation object such as toner or a medium.

The light receiving and emitting element module 1 includes a substrate 2, a plurality of light emitting elements 3*a* and a plurality of light receiving elements 3*b* arranged on the upper surface of the substrate 2, an outer wall 4 that is frame-shaped and arranged to enclose the plurality of light emitting elements 3*a* and the plurality of light receiving elements 3*b*, a light shielding wall 5 that is positioned inside the outer wall 4 and partitions an inner space 4*a* of the outer wall 4 into spaces respectively corresponding to the light emitting elements 3*a* and the light receiving elements 3*b*, and an upper wall 7 that covers the substrate 2 and a light receiving and emitting element array 3, and supports a light emitting element-side lens 6*a* and a light receiving element-side lens 6*b* respectively corresponding to the light emitting elements 3*a* and the light receiving elements 3*b*.

The plurality of light emitting elements 3*a* and the plurality of light receiving elements 3*b* according to the example are formed on the upper surface of a semiconductor substrate 30 in an integrated manner, as the light receiving and emitting element array 3. According to this configuration, the light emitting elements 3*a* and the light receiving elements 3*b* can be arranged at predetermined positions, and a sensing property can be enhanced. Further, the light receiving and emitting element array 3 in which the plurality of light emitting elements 3*a* and the plurality of light receiving elements 3*b* are formed in an integrated manner is used in the example. However, one light emitting element 3*a* and one light receiving element 3*b* may be formed, or the light emitting elements 3*a* and the light receiving elements 3*b* may be separately formed. The light receiving and emitting element array may be a light emitting element array in which the plurality of light emitting elements 3*a* are formed in an integrated manner and a light receiving element array in which the plurality of light receiving elements 3*b* are formed in an integrated manner. Further, the light receiving and emitting element array may be a combination thereof.

The substrate 2 functions as a wiring substrate that is respectively connected to the light receiving and emitting element array 3 and an external apparatus, in order to apply bias to the light emitting elements 3a and the light receiving elements 3b formed in the light receiving and emitting element array 3, or to cause the light receiving and emitting element array 3 and external apparatus to transmit or receive electric signals.

The semiconductor substrate 30 is formed with one conductivity-type semiconductor material. The concentration of one conductivity-type impurities is not limited, but it is desirable to have high electric resistance. In the example, an n-type silicon (Si) substrate including phosphorus (P) in the concentration of $1 \times 10^{17}$ atoms/cm$^3$ to $2 \times 10^{17}$ atoms/cm$^3$ as the one conductivity-type impurities in the silicon (Si) substrate is used. In addition to phosphorus (P), for example, nitrogen (N), arsenic (As), antimony (Sb) and bismuth (Bi) are included as the n-type impurity, and the doping concentration is $1 \times 10^{16}$ atoms/cm$^3$ to $1 \times 10^{20}$ atoms/cm$^3$. Hereinafter, the n-type is referred to as the one conductivity type, and the p-type is referred to as the reverse conductivity type.

The plurality of light emitting elements 3a are arranged on the upper surface of the semiconductor substrate 30 in a column shape, and the plurality of light receiving elements 3b are arranged in the column shape, along the column of the light emitting elements 3a. The light emitting elements 3a function as a light source of the light with which the irradiation object is irradiated, and the light emitted from the light emitting elements 3a is reflected by the irradiation object and incident on the light receiving elements 3b. The light receiving elements 3b function as a light detecting unit that detects the incidence of the light.

Figure 2:
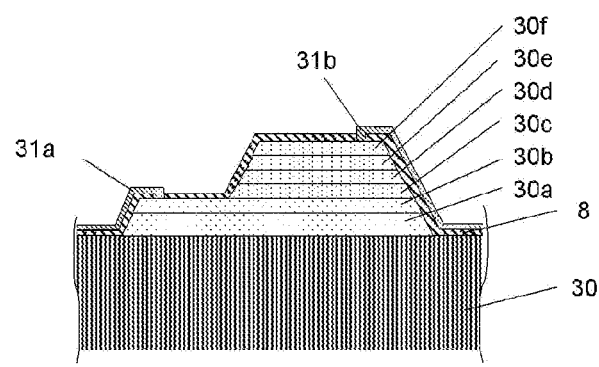
FIG. 2(*a*) is a cross-sectional view illustrating a light emitting element that configures the light receiving and emitting element module illustrated in FIG. 1.
Figure 2:
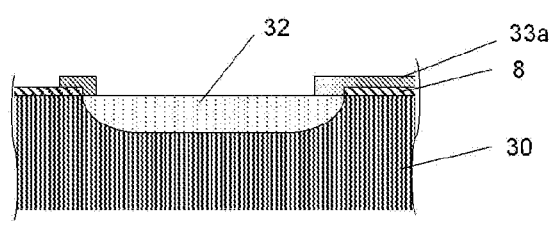

The light emitting elements 3a are formed by stacking a plurality of semiconductor layers on the upper surface of the semiconductor substrate 30, as illustrated in FIG. 2(a).

First, a buffer layer 30a that buffers a lattice constant difference between the semiconductor substrate 30 and the semiconductor layer (in the case of the example, an n-type contact layer 30b described below) stacked on the upper surface of the semiconductor substrate 30 is formed on the upper surface of the semiconductor substrate 30. The buffer layer 30a has a function of reducing lattice defects such as lattice strains which are generated between the semiconductor substrate 30 and the semiconductor layer by buffering the lattice constant difference between the semiconductor substrate 30 and the semiconductor layer formed on the upper surface of the semiconductor substrate 30, and further reducing lattice defects or crystal detects in the entire semiconductor layers formed on the upper surface of the semiconductor substrate 30.

The buffer layer 30a according to the example is formed of gallium arsenide (GaAs) that does not include impurities, and the thickness thereof is about 2 µm to 3 µm. Further, if the lattice constant difference between the semiconductor substrate 30 and the semiconductor layer stacked on the upper surface of the semiconductor substrate 30 is not great, the buffer layer 30a may be omitted.

The n-type contact layer 30b is formed on the upper surface of the buffer layer 30a. Gallium arsenide (GaAs) in the n-type contact layer 30b is doped with silicon (Si) or selenium (Se) or the like which is an n-type impurity, and a doping concentration is about $1 \times 10^{16}$ to $1 \times 10^{20}$ atoms/cm$^3$, and the thickness is about 0.8 µm to 1 µm.

In the example, the n-type contact layer 30b is doped with silicon (Si) as the n-type impurity in a doping concentration of $1 \times 10^{18}$ atoms/cm$^3$ to $2 \times 10^{18}$ atoms/cm$^3$. A portion of the upper surface of the n-type contact layer 30b is exposed, and the exposed portion is electrically connected to the substrate 2 by wire bonding or flip-chip connection through a light emitting element-side first electrode 31a. The n-type contact layer 30b has a function of reducing the connection resistance with the light emitting element-side first electrode 31a connected to the n-type contact layer 30b.

The light emitting element-side first electrode 31a is formed to have a thickness of about 0.5 µm to 5 µm by using a gold (Au)-antimony (Sb) alloy, a gold (Au)-germanium (Ge) alloy, or an Ni-based alloy, or the like. In addition, since the light emitting element-side first electrode 31a is arranged on an insulating layer 8 that is formed to cover the upper surface of the semiconductor substrate 30 and the upper surface of the n-type contact layer 30b, the light emitting element-side first electrode 31a is electrically insulated from the semiconductor layers other than the semiconductor substrate 30 and the n-type contact layer 30b.

The insulating layer 8 is made of, for example, an inorganic insulating film such as silicon nitride ($SiN_x$) or silicon oxide ($SiO_2$), or an organic insulating film such as polyimide, and the thickness thereof is about 0.1 µm to 1 µm.

An n-type clad layer 30c is formed on the upper surface of the n-type contact layer 30b, and has a function of enclosing holes in an active layer 30d described below. In the n-type clad layer 30c, aluminum gallium arsenide (AlGaAs) is doped with silicon (Si) or selenium (Se) which is the n-type impurity. The doping concentration is about $1 \times 10^{16}$ atoms/cm$^3$ to $1 \times 10^{20}$ atoms/cm$^3$, and the thickness thereof is about 0.2 µm to 0.5 µm. In the example, the n-type clad layer 30c is doped with silicon (Si) as the n-type impurity in a doping concentration of $1 \times 10^{17}$ atoms/cm$^3$ to $5 \times 10^{17}$ atoms/cm$^3$.

The active layer 30d is formed on the upper surface of the n-type clad layer 30c, and functions as a light emitting layer that emits light by the concentration and the recombination of carriers such as electrons or holes. The active layer 30d is made of aluminum gallium arsenide (AlGaAs) that does not include impurities, and the thickness thereof is about 0.1 µm to 0.5 µm. Further, the active layer 30d according to the example is a layer which does not include impurities. However, the active layer 30d may be a p-type active layer that includes p-type impurities, or may be an n-type active layer that includes n-type impurities, and it is only desired that the band gap of the active layer be smaller than band gaps of the n-type clad layer 30c or a p-type clad layer 30e described below.

The p-type clad layer 30e is formed on the upper surface of the active layer 30d, and has a function of enclosing electrons in the active layer 30d. In the p-type clad layer 30e, aluminum gallium arsenide (AlGaAs) is doped with zinc (Zn), magnesium (Mg), or carbon (C) which is the p-type impurity. The doping concentration is about $1 \times 10^{16}$ atoms/cm$^3$ to $1 \times 10^{20}$ atoms/cm$^3$, and the thickness thereof is about 0.2 µm to 0.5 µm. In the example, the p-type clad layer 30e is doped with magnesium (Mg) as the p-type impurity in a doping concentration of $1 \times 10^{19}$ atoms/cm$^3$ to $5 \times 10^{20}$ atoms/cm$^3$.

A p-type contact layer 30f is formed on the upper surface of the p-type clad layer 30e. In the p-type contact layer 30f, aluminum gallium arsenide (AlGaAs) is doped with zinc (Zn), magnesium (Mg), or carbon (C) which is the p-type impurity. The doping concentration is about $1 \times 10^{16}$ atoms/cm$^3$ to $1 \times 10^{20}$ atoms/cm$^3$, and the thickness thereof is about 0.2 µm to 0.5 µm.

The p-type contact layer 30f is electrically connected to the substrate 2 by wire bonding or flip-chip connection through a light emitting element-side second electrode 31b.

The p-type contact layer 30f has a function of decreasing the contact resistance with light emitting element-side second electrode wiring 31b connected to the p-type contact layer 30f.

Further, if the light emitting element-side first electrodes 31a are provided as individual electrodes for corresponding light emitting elements, the light emitting element-side second electrode 31b does not need to be provided for each light emitting element, and at least one common light emitting element-side first electrode 31b may be provided. Obviously, the light emitting element-side first electrode 31a may be provided as a common electrode, and the light emitting element-side first electrodes 31b may be provided for the respective light emitting elements as individual electrodes.

Moreover, a cap layer having a function of preventing the oxidation of the p-type contact layer 30f may be formed on the upper surface of the p-type contact layer 30f. The cap layer is made of, for example, gallium arsenide (GaAs) that does not include impurities, and the thickness thereof may be about 0.01 μm to 0.03 μm.

The light emitting element-side second electrode 31b is made of an AuNi alloy, an AuCr alloy, an AuTi alloy, or an AlCr alloy obtained by combining, for example, gold (Au) or aluminum (Al) with nickel (Ni), chromium (Cr), or titanium (Ti) which is an adhesion layer, and the thickness thereof is about 0.5 μm to 5 μm. Since the light emitting element-side second electrode 31b is arranged on the insulating layer 8 formed to cover the upper surface of the semiconductor substrate 30 and the upper surface of the p-type contact layer 30f, the light emitting element-side second electrode 31b is electrically insulated from the semiconductor substrate 30 and the semiconductor layers other than the p-type contact layer 30f.

The active layer 30d emits light by applying bias between the light emitting element-side first electrode 31a and the light emitting element-side second electrode 31b and thereby the light emitting element 3a configured in this manner functions as a light source.

As illustrated in FIG. 2(b), the light receiving element 3b is configured by providing a p-type semiconductor area 32 on the upper surface of the semiconductor substrate 30 so that a PN junction is formed with the n-type semiconductor substrate 30. The p-type semiconductor area 32 is formed by diffusing p-type impurities into the semiconductor substrate 30 at high concentration. Examples of the p-type impurity include zinc (Zn), magnesium (Mg), carbon (C), boron (B), indium (In), or selenium (Se), and the doping concentration is about $1 \times 10^{16}$ atoms/cm$^3$ to $1 \times 10^{20}$ atoms/cm$^3$. In the example, boron (B) is diffused as the p-type impurity so that the thickness of the p-type semiconductor area 32 is about 0.5 μm to 3 μm.

The p-type semiconductor area 32 is electrically connected to a light receiving element-side first electrode 33a. Though it is not illustrated, a light receiving element-side second electrode 33b is electrically connected to the semiconductor substrate 30 which is an n-type semiconductor.

Since the light receiving element-side first electrode 33a is arranged on the insulating layer 8 on the upper surface of the semiconductor substrate 30, the light receiving element-side first electrode 33a is electrically insulated from the semiconductor substrate 30.

The light receiving element-side first electrode 33a and the light receiving element-side second electrode 33b are made of, for example, a gold (Au)-chromium (Cr) alloy, an aluminum (AD-chromium (Cr) alloy, or a platinum (Pt)-titanium (Ti) alloy, to have a thickness of about 0.5 μm to 5 μm.

If light is incident on the p-type semiconductor area 32, a photoelectric current is generated by a photoelectric effect, and the photoelectric current is output through the light receiving element-side first electrode 33a so that the light receiving element 3b configured as described above functions as the light detecting unit. Further, it is preferable to apply reverse bias between the light receiving element-side first electrode 33a and the light receiving element-side second electrode 33b, since the light detection sensitivity of the light receiving element 3b increases.

The outer wall 4 is connected to the upper surface of the substrate 2 using an adhesive 9 (not illustrated) so as to enclose the light receiving and emitting element array 3. The outer wall 4 has a function of suppressing the light generated from the light emitting element 3a scattering in directions other than the direction toward the irradiation object, or a function of suppressing light other than the light reflected from the irradiation object being incident on the light receiving element 3b or a function of protecting the substrate 2 and the light receiving and emitting element array 3 from an external environment.

The outer wall 4 is made of general-purpose plastic such as a polypropylene resin (PP), a polystyrene resin (PS), a polyvinyl chloride (PVC), a polyethylene terephthalate resin (PET), or an acrylonitrile/butadiene/styrene resin (ABS), an engineering plastic such as a polyamide resin (PA), or a polycarbonate resin (PC), a super engineering plastic such as a liquid crystal polymer, or a metallic material such as aluminum (Al) or titanium (Ti).

Further, it is only desired that dimensions of the depth and the width of the outer wall 4 be at least dimensions that can cover the light emitting elements 3a and the light receiving elements 3b. The dimensions of the depth and the width of the outer wall 4 according to the example are the same as the dimensions of the depth and the width of the substrate 2.

The light shielding wall 5 is arranged on the inner side of the outer wall 4 so as to partition the inner-side space 4a of the outer wall 4 into spaces corresponding to the light emitting elements 3a and the light receiving elements 3b. The arrangement so as to partition the inner-side space 4a in the outer wall 4 into the spaces corresponding to the light emitting elements 3a and the light receiving elements 3b refers to the arrangement in which the light emitting elements 3a exist in one space formed with the light shielding wall 5 and the outer wall 4, and the light receiving elements 3b exist in the other space when the light receiving and emitting element module 1 is viewed from the light receiving and emitting element array 3 side.

The light shielding wall 5 has a function of suppressing the light generated from the light emitting element 3a incident on the light receiving element 3b without being reflected on the irradiation object.

The light shielding wall 5 is arranged so as not to contact with the light receiving and emitting element array 3 and the substrate 2. According to this arrangement, even if the dimensions of the light shielding wall 5 increase due to thermal expansion by the heat radiated by the driving force of the light receiving and emitting element module 1 or the heat received from an external environment, it is possible to maintain the positional relationship between the light emitting element 3a and the light receiving element 3b so that the sensing performance is enhanced. This is because the light receiving and emitting element array 3, in which the light emitting elements 3a and the light receiving elements 3b are formed, and the substrate 2 are not in contact with each other.

The light shielding wall 5 includes a light emitting element-side shading surface 5a positioned on the light emitting element 3a side, a light receiving element-side shading surface 5b positioned on the light receiving element 3b side, and a lower surface 5c that is in contact with the light emitting element-side shading surface 5a and the light receiving element-side shading surface 5b.

The light emitting element-side shading surface 5a and the light receiving element-side shading surface 5b may have any shape, as long as they can partition the inner space 4a of the outer wall 4 into spaces corresponding to the light emitting element 3a side and the light receiving element 3b side. In the example, the shading surfaces 5a and 5b are arranged in the normal direction of the upper surface of the light receiving and emitting element array 3 and along the respective arrangement directions of the light emitting elements 3a and the light receiving elements 3b, and contact with the outer wall 4. The lengths thereof in the arrangement directions of the light emitting elements 3a and the light receiving elements 3b are required to be longer than the length of the column of the light emitting elements 3a. Otherwise, the light generated by the light emitting elements 3a is directly emitted to the space on the light receiving element 3b side.

The lower surface 5c according to the example becomes an inclined surface 5d that is inclined to the light emitting elements 3a side with respect to the upper surface of the light receiving and emitting element array 3. Even if the light generated by the light emitting elements 3a is incident on the lower surface 5c, such lower surface 5c can reflect the generated light on the light emitting element 3a side, and suppress light leaking into the light receiving element 3b side, as stray light.

Figure 5:
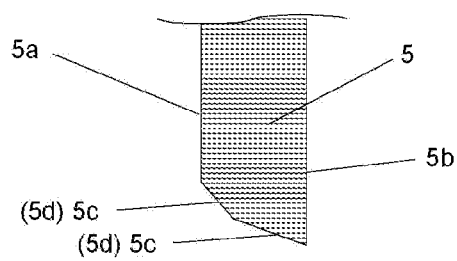
FIG. 5 includes cross-sectional views illustrating a main section of the light shielding wall for describing modifications of the inclined surface.
Figure 5:
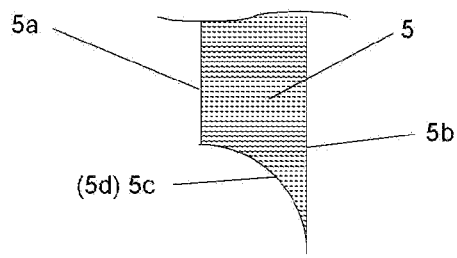
Figure 5:
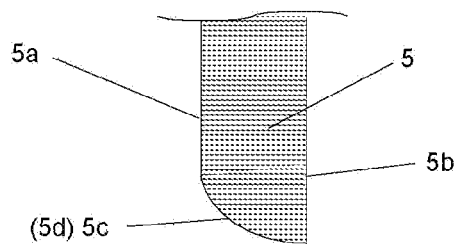

Further, the lower surface 5c according to the example is formed of one flat inclined surface 5d, but may include a plurality of inclined surfaces as illustrated in FIG. 5(a), or may be curved surfaces as illustrated in FIGS. 5(b) and 5(c). In addition, the lower surface 5c may have a surface parallel to the substrate 2 or the upper surface of the light receiving and emitting element array 3.

Figure 3:
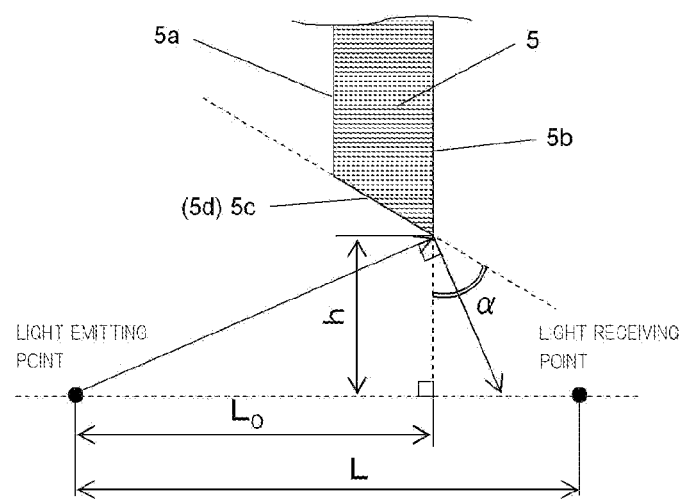
FIG. 3 is a schematic diagram for describing a position and an inclined surface of a light shielding wall.

As in the example of FIG. 3, when a distance between an arbitrary light emitting point of the light emitting element 3a and an arbitrary light receiving point of the light receiving element 3b is L, a distance of a perpendicular line from a virtual straight line that passes through the light emitting point and the light receiving point to an arbitrary point of the inclined surface is h, a distance from the light emitting point to the perpendicular line along the virtual straight line is $L_0$, and an angle formed with the perpendicular line and the inclined surface on the light receiving element side is α, it is preferable that such light shielding wall 5 has a position and a form that satisfies the following expression.

$$L > L_0 + h \times \tan\{2\alpha - \tan^{-1}(h/L_0) - 90\} (h > 0)$$

Further, as in the example of FIG. 3, if there is not an inclined surface on the light receiving element side with respect to the perpendicular line, an angle formed with a virtual surface including the inclined surface may be calculated as α.

If the arrangement of the light shielding wall 5 and the shape of the inclined surface 5d are set to satisfy the expression above, even if the light generated from the light emitting element 3a is reflected on the inclined surface, theoretically no light is incident on the light receiving element 3b. Therefore, it is possible to enhance the sensing performance.

Further, if there is a plurality of inclined surfaces 5d, the respective inclined surfaces 5d is desired to satisfy the expression above. If the inclined surface 5d is curved, the angle formed by the perpendicular line and a tangential line on the curved line on the light receiving element may be a.

In the same manner as the outer wall 4, the light shielding wall 5 may be formed of general-purpose plastic such as a polypropylene resin (PP), a polystyrene resin (PS), a polyvinyl chloride (PVC), a polyethylene terephthalate resin (PET), or an acrylonitrile/butadiene/styrene resin (ABS), an engineering plastic such as a polyamide resin (PA) or a polycarbonate resin (PC), a super engineering plastic such as a liquid crystal polymer, and a metallic material such as aluminum (Al) or titanium (Ti).

The upper wall 7 is arranged to cover the substrate 2 and the light receiving and emitting element array 3. The upper wall 7 according to the example is arranged in contact with the upper end of the outer wall 4. Then, through holes 7a and 7b are formed at positions corresponding to the light emitting elements 3a and the light receiving elements 3b. The upper wall 7 has a function of protecting the substrate 2 and the light receiving and emitting element array 3 from the external environment and functions as a support for the lenses 6a and 6b described below.

In the same manner as the outer wall 4 and the light shielding wall 5, the upper wall 7 is formed of general-purpose plastic such as a polypropylene resin (PP), a polystyrene resin (PS), a polyvinyl chloride (PVC), a polyethylene terephthalate resin (PET), or an acrylonitrile/butadiene/styrene resin (ABS), an engineering plastic such as a polyamide resin (PA) or a polycarbonate resin (PC), or a super engineering plastic such as a liquid crystal polymer, or a metallic material such as aluminum (Al) or titanium (Ti).

Further, the outer wall 4, the light shielding wall 5, and the upper wall 7 in the example are formed in an integrated manner by injection molding with a polycarbonate resin (PC).

The light emitting element-side lens 6a and the light receiving element-side lens 6b are arranged to correspond to the through holes 7a and 7b of the upper wall 7, and have a function of concentrating the light generated from the light emitting elements 3a and a function of concentrating the irradiation object, respectively. Further, in the specification, the light emitting element-side lens 6a and the light receiving element-side lens 6b may be simply referred to as the lenses 6a and 6b. By providing the lenses 6a and 6b as described above, when a distance between the light receiving and emitting element module 1 and the irradiation object are long, sensing performance may be enhanced.

Materials of the lenses 6a and 6b may be plastic including a thermosetting resin such as a silicone resin, a urethane resin, and an epoxy resin, a thermoplastics resin such as a polycarbonate resin and an acrylic resin, or sapphire, inorganic glass, and the like.

The lenses 6a and 6b according to the example are cylindrical lenses formed of a silicone resin, and have curvatures in the direction perpendicular to the longitudinal direction of the through holes 7a and 7b that is the direction along columns of the light receiving elements 3a and the light emitting elements 3b formed in the light receiving and emitting element array 3. The lenses 6a and 6b may be attached to the upper wall 7 by an organic adhesive such as a silicone resin.

In the example, a straight line obtained by connecting centers of the light emitting units of the light emitting elements 3a and a straight line obtained by connecting centers of the light receiving units of the light receiving elements 3b are substantially identical respectively to optical axes of the lenses 6a and 6b, and the optical axes are substantially identical to the normal direction upwardly from the upper surface of the light receiving and emitting element array 3. According to this configuration, it is possible to emit the light generated from the light emitting elements 3a to the irradiation object at high illuminance so that the illuminance when the light generated from the light emitting elements 3a is reflected by the irradiation object and the light is received by the light receiving elements 3b can be enhanced. Therefore, it is possible to realize the light receiving and emitting element module 1 having high sensitivity, that is, having the high sensing performance.

Here, the center of the light receiving unit is the center of the p-type semiconductor area 32 when the semiconductor substrate 30 is viewed from the p-type semiconductor area 32 side in plan view. In the same manner, the center of the light emitting unit is the center of the active layer 30d when the semiconductor substrate 30 is viewed from the p-type contact layer 30f in plan view. Since the p-type clad layer 30e, the p-type contact layer 30f and the like are stacked on the upper surface of the active layer 30d, the center of the active layer 30d is not directly observed. Therefore, the center of the p-type contact layer 30f may be considered as the center of the active layer 30d. This is because, as described above, since the respective layers of the semiconductor layer are excessively thin, even if etching for forming the light emitting element array 3a and etching for exposing a portion of the upper surface of the n-type contact layer 30b are separately performed, the center of the p-type contact layer 30f and the center of the active layer 30d are substantially identical to each other when viewed from the p-type contact layer 30f side.

In addition, the lenses 6a and 6b according to the example are cylindrical lenses, but may be plano-convex lenses corresponding to the light receiving element 3a and the light emitting element 3b, respectively.

Further, the upper wall 7 and the lenses 6a and 6b are provided in the example, but in the case where the light receiving and emitting element module 1 and the irradiation object are provided at a short distance, or the like, the lenses 6a and 6b may not be provided, and the upper wall 7 may not be necessarily provided.

(Manufacturing Method of Light Receiving and Emitting Element Module)

Next, an exemplary method of manufacturing the light receiving and emitting element module 1 is described.

In the first place, a method of manufacturing the light receiving and emitting element array 3 is described.

First, the semiconductor substrate 30 in which silicon (Si) is doped with n-type impurities is prepared. Then, a diffusion element film S (not illustrated) made of silicon oxide ($SiO_2$) is formed on the semiconductor substrate 30 by using a known thermal oxidation method.

The diffusion blocking film S is coated with photoresist, the photoresist is exposed and developed to a desired pattern by a known photolithography method, and then an opening portion Sa (not illustrated) for forming the p-type semiconductor area 32 is formed in the diffusion blocking film S by a known wet etching method. The opening portion Sa may not necessarily penetrate the diffusion blocking film S.

Then, the diffusion blocking film S is coated with a poly boron film (PBF). Subsequently, boron (B) included in a poly boron film (PBF) is diffused to the inside of the semiconductor substrate 30 through the opening portion Sa of the diffusion blocking film S by using a thermal diffusion method so that the p-type semiconductor area 32 is formed. At this point, the thickness of the poly boron film (PBF) is 0.1 μm to 1 μm, and thermal diffusion is performed in an atmosphere including nitrogen ($N_2$) and oxygen ($O_2$) in the temperature of 700° C. to 1200° C. Thereafter, the diffusion blocking film S is removed.

Next, a natural oxidation film formed on the surface of the semiconductor substrate 30 is removed by performing a heat treatment on the semiconductor substrate 30 in a reaction furnace of a metal-organic chemical vapor deposition (MOCVD) apparatus. The heat treatment is performed for 10 minutes in the temperature of, for example, 1,000° C.

Subsequently, respective semiconductor layers that configure the light emitting element 3a (the buffer layer 30a, the n-type contact layer 30b, the n-type clad layer 30c, the active layer 30d, the p-type clad layer 30e, and the p-type contact layer 30f) are sequentially stacked on the semiconductor substrate 30 by using the MOCVD method. Then, stacked semiconductor layers L (not illustrated) are coated with the photoresist, the photoresist is exposed and developed to a desired pattern by a known photolithography method, and then the light emitting element 3a is formed by a known wet etching method. Further, etching is performed a plurality of times so that a portion of the upper surface of the n-type contact layer 30b is exposed. Thereafter, the photoresist is removed.

Next, the insulating layer 8 is formed to cover the exposed surface of the light emitting element 3a and the upper surface of the semiconductor substrate 30 (including the n-type semiconductor area 32) by using a known thermal oxidation method, sputtering method, or plasma CVD method. Subsequently, the insulating layer 8 is coated with the photoresist, the photoresist is exposed and developed to a desired pattern by a known photolithography method, and openings for connecting the light emitting element-side first electrode 31a, the light emitting element-side second electrode 31b, and the light receiving element-side first electrode 33a described below, respectively to the n-type contact layer 30b, the p-type contact layer 30f, and the p-type semiconductor area 32 are formed in the insulating layer 8 by a known wet etching method. Thereafter, the photoresist is removed.

Next, the insulating layer 8 is coated with the photoresist, the photoresist is exposed and developed to a desired pattern by a known photolithography method, an alloy film for forming the light emitting element-side first electrode 31a and the light emitting element-side second electrode 31b is formed by using a known resistance heating method or sputtering method. Then, a known lift-off method is used to remove the photoresist, and form the light emitting element-side first electrode 31a and the light emitting element-side second electrode 31b in a desired shape. In the same manner, the light receiving element-side first electrode 33a and the light receiving element-side second electrode 33b are formed by the same processes.

Next, a method of manufacturing the substrate 2 is described.

The substrate 2 according to the example is formed of ceramics and is manufactured in the processes as follows. First, a ceramic green sheet manufactured by a known method is prepared.

Next, printing is performed with metal pastes that form the first electrode for the light emitting element 31a, the second electrode for the light emitting element 31b, the first electrode for the light receiving element 33a, the second electrode for the light receiving element 33b, and electric wires for connecting these electrodes with each other or with an external apparatus on the ceramic green sheet. As the metal paste that becomes electric wires, the metal paste including metal such as tungsten (W), molybdenum (Mo), manganese (Mn), and copper (Cu) are included.

Further, the substrate 2 may be formed with a resin. In this case, the following methods can be considered as the manufacturing method of the substrate 2. First, a precursor sheet formed of a thermosetting resin is prepared. Next, lead terminals formed of a metallic material, which become the first electrode for the light emitting element 31a, the second electrode for the light emitting element 31b, the first electrode for the light receiving element 33a, the second electrode for the light receiving element 33b, and electric wires for connecting these electrode with each other or with the external apparatus, are arranged between precursor sheets, and a plurality of precursor sheets are stacked so that the lead terminal which is formed of a metal material are buried in the precursor sheets. As the forming material of the lead terminals, metallic materials such as copper (Cu), silver (Ag), aluminum (Al), an iron (Fe)-nickel (Ni)-cobalt (Co) alloy, and an iron (Fe)-nickel (Ni) alloy are included. Then, the substrate 2 is completed by performing thermosetting.

The light receiving and emitting element array 3 prepared as described above is arranged on the upper surface of the substrate 2. If the light receiving and emitting element array 3 and the substrate 2 are electrically connected by wire bonding, the light receiving and emitting element array 3 and the substrate 2 may be bonded by an adhesive such as an epoxy resin or a silver paste. If the light receiving and emitting element array 3 and the substrate 2 are connected by flip-chip bonding, electric connection through a solder materials such as tin solder, silver solder, or copper solder, a combination of gold stud bump and tin solder, or an anisotropic conductive film may be performed together.

Then, the lenses 6a and 6b are bonded to a member in which the outer wall 4, the light shielding wall 5, and the upper wall 7 are formed in an integrated manner by the silicone resin or the like, and this is bonded to the upper surface of the substrate 2, by using a double-sided tape in which a base material formed of polyester, nonwoven fabric, acryl foam, polyimide, polyvinyl chloride (PVC), or aluminum foil is coated with an adhesive such as an adhesive based on a resin such as an epoxy resin and a silicone resin, an acrylic adhesive, a rubber adhesive, or a silicone-based adhesive.

(Sensor Device)

Next, a sensor device 100 including the light receiving and emitting element module 1 is described. Herein below, the case where the light receiving and emitting element module 1 is applied to a sensor device that detects a position of toner T (irradiation object) attached to an intermediate transfer belt V in an image forming apparatus such as a copying machine or a printer is described.

Figure 4:
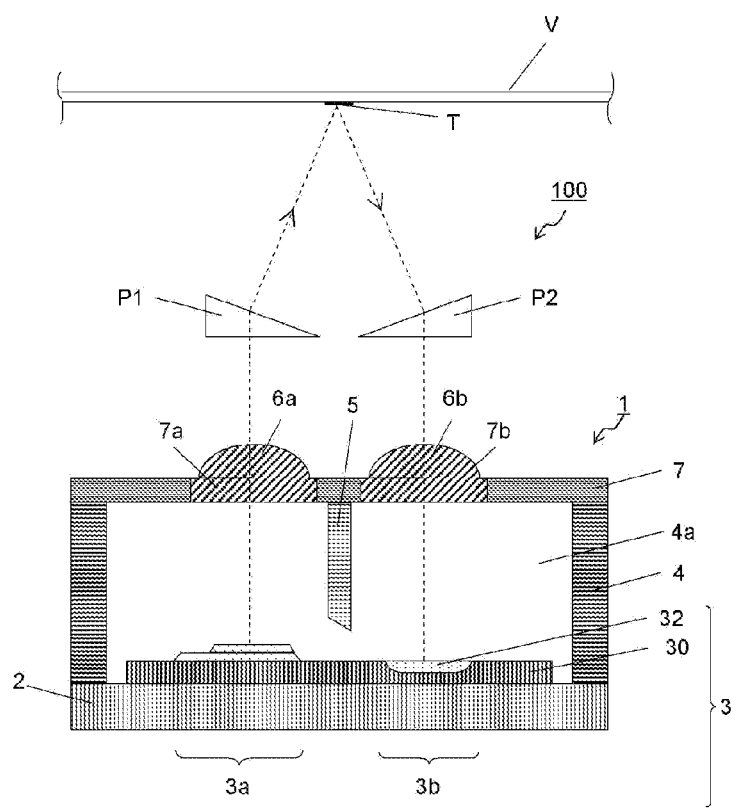
FIG. 4 is a cross-sectional view schematically illustrating an exemplary embodiment of a sensor device using the light receiving and emitting element module illustrated in FIG. 1.

As illustrated in FIG. 4, the sensor device 100 according to the example is arranged so that surfaces on which the light emitting elements 3a and the light receiving elements 3b of the light receiving and emitting element module 1 are formed to face the intermediate transfer belt V. Then, light is emitted from the light emitting elements 3a to the toner T on the intermediate transfer belt V. In the example, a prism P1 is arranged above the light emitting elements 3a, or a prism P2 is arranged above the light receiving elements 3b so that the light generated from the light emitting elements 3a passes through the light emitting element-side lens 6a, is refracted by the prism P1, and is incident on the toner T on the intermediate transfer belt V. Then, specular reflection light L2 of incident light L1 is refracted by the prism P2, passes through the light receiving element-side lens 6b, and is received by the light receiving elements 3b. Photoelectric current corresponding to the intensity of the received light is generated in the light receiving elements 3b, and the photoelectric current is detected by the external apparatus through the light receiving element-side first electrode 33a or the like.

As described above, the sensor device 100 according to the example can detect photoelectric current corresponding to the intensity of the specular reflection light from the toner T. Therefore, a position of the toner T on the intermediate transfer belt V can be detected, for example, as in the case where, if a photoelectric current value detected from an n-th light receiving element from one end of the column of the light receiving elements 3b is the greatest, the toner T is positioned at a position corresponding to the n-th light receiving elements 3b. Further, since the intensity of the specular reflection light also corresponds to the concentration of the toner T, the concentration of the toner T can be detected according to the size of the generated photoelectric current. In the same manner, since the intensity of the specular reflection light corresponds to the distance of the toner T from the light receiving and emitting element array 3, the distance between the light receiving and emitting element array 3 and the toner T can be detected according to the size of the generated photoelectric current.

In the sensor device 100 according to the example, it is possible to achieve the advantages of the light receiving and emitting element module 1 described above.

In the above, examples of a specific embodiment of the invention are described, but the invention is not limited thereto, and various kinds of modification are possible without departing from the gist of the invention.

REFERENCE SIGNS LIST

1 LIGHT RECEIVING AND EMITTING ELEMENT MODULE
2 SUBSTRATE
3 LIGHT RECEIVING AND EMITTING ELEMENT ARRAY
3a LIGHT EMITTING ELEMENT
3b LIGHT RECEIVING ELEMENT
4 OUTER WALL
4a INNER SPACE
5 LIGHT SHIELDING WALL
5a LIGHT EMITTING ELEMENT-SIDE SHADING SURFACE
5b LIGHT RECEIVING ELEMENT-SIDE SHADING SURFACE
5c LOWER SURFACE
5d INCLINED SURFACE
6a LIGHT EMITTING ELEMENT-SIDE LENS
6b LIGHT RECEIVING ELEMENT-SIDE LENS
7 UPPER WALL
8 INSULATING LAYER
9 ADHESIVE
30 SEMICONDUCTOR SUBSTRATE
30a BUFFER LAYER
30b N-TYPE CONTACT LAYER
30c N-TYPE CLAD LAYER
30d ACTIVE LAYER
30e P-TYPE CLAD LAYER
30f P-TYPE CONTACT LAYER

31a LIGHT EMITTING ELEMENT-SIDE FIRST ELECTRODE
31b LIGHT EMITTING ELEMENT-SIDE SECOND ELECTRODE
32 P-TYPE SEMICONDUCTOR AREA
33a LIGHT RECEIVING ELEMENT-SIDE FIRST ELECTRODE
33b LIGHT RECEIVING ELEMENT-SIDE SECOND ELECTRODE
100 SENSOR DEVICE

The invention claimed is:

1. A light receiving and emitting element module comprising:
a substrate;
a light emitting element and a light receiving element on an upper surface of the substrate;
an outer wall that is frame-shaped and encloses the light emitting element and the light receiving element on the upper surface of the substrate; and
a light shielding wall that is positioned inside the outer wall and partitions an internal space of the outer wall into spaces respectively corresponding to the light emitting element and the light receiving element, wherein the light shielding wall includes a light emitting element-side shading surface on the light emitting element side, a light receiving element-side shading surface on the light receiving element side, and a lower surface that is connected to each of the light emitting element-side shading surface and the light receiving element-side shading surface, and that faces the substrate, and the lower surface is positioned above the light emitting element and has an inclined surface inclined with respect to the upper surface of the substrate.

2. The light receiving and emitting element module according to claim 1, wherein $L > L_0 + h \times \tan\{2\alpha - \tan^{-1}(h/L_0) - 90\}$ $(h > 0)$ is satisfied, where L is a distance between a light emitting point in the light emitting element and a light receiving point in the light receiving element, h is a distance of a perpendicular line from a virtual straight line that passes through the light emitting point and the light receiving point to the inclined surface, $L_0$ is a distance from the light emitting point to the perpendicular line along the virtual straight line, and a is an angle formed with the perpendicular line and an inclined surface on the light receiving element side from the perpendicular line.

3. The light receiving and emitting element module according to claim 1, wherein the inclined surface is positioned on the light emitting element side in the lower surface.

4. The light receiving and emitting element module according to claim 1, wherein the light emitting element is formed by stacking a plurality of semiconductor layers on an upper surface of a semiconductor substrate, and the light receiving element is formed by doping the upper surface of the semiconductor substrate with an impurity.

5. A sensor device using the light receiving and emitting element module according to claim 1, wherein the sensor device irradiates an irradiation object with light from the light emitting element, and detects at least one of location information, distance information, and density information of the irradiation object in accordance with electric current output from the light receiving element in response to reflected light from the irradiation object.

6. The light receiving and emitting element module according to claim 2, wherein the inclined surface is positioned on the light emitting element side in the lower surface.

7. A sensor device using the light receiving and emitting element module according to claim 2, wherein the sensor device irradiates an irradiation object with light from the light emitting element, and detects at least one of location information, distance information, and density information of the irradiation object in accordance with electric current output from the light receiving element in response to reflected light from the irradiation object.

8. A sensor device using the light receiving and emitting element module according to claim 6, wherein the sensor device irradiates an irradiation object with light from the light emitting element, and detects at least one of location information, distance information, and density information of the irradiation object in accordance with electric current output from the light receiving element in response to reflected light from the irradiation object.

9. The sensor device according to claim 8, wherein the light emitting element is formed by stacking a plurality of semiconductor layers on an upper surface of a semiconductor substrate, and the light receiving element is formed by doping the upper surface of the semiconductor substrate with an impurity.

* * * * *